(12) United States Patent
Maeda et al.

(10) Patent No.: US 7,470,561 B2
(45) Date of Patent: Dec. 30, 2008

(54) ORGANIC SEMICONDUCTOR MATERIAL, ORGANIC SEMICONDUCTOR STRUCTURE, AND ORGANIC SEMICONDUCTOR DEVICE

(75) Inventors: Hiroki Maeda, Tokyo (JP); Ken Tomino, Tokyo (JP); Shigeru Sugawara, Tokyo (JP); Junichi Hanna, Yokohama (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 586 days.

(21) Appl. No.: 11/092,341

(22) Filed: Mar. 29, 2005

(65) Prior Publication Data

US 2006/0054884 A1    Mar. 16, 2006

(30) Foreign Application Priority Data

Mar. 31, 2004   (JP)   ............... 2004-108526

(51) Int. Cl.
*H01L 51/00*   (2006.01)
*H01L 35/24*   (2006.01)
*H01L 29/786*  (2006.01)
*C09K 19/58*   (2006.01)
*C09K 19/38*   (2006.01)

(52) U.S. Cl. ......................... 438/99; 257/40; 428/1.1; 428/1.2; 428/1.3; 428/1.4; 252/299.01; 252/299.3

(58) Field of Classification Search ............... 428/1.1, 428/1.2, 1.3, 1.4; 252/299.01, 299.3; 257/40; 438/99

See application file for complete search history.

(56) References Cited

U.S. PATENT DOCUMENTS

| | | | |
|---|---|---|---|
| 6,511,612 B1 * | 1/2003 | Hall et al. | 252/299.01 |
| 7,102,154 B2 * | 9/2006 | Hanna et al. | 257/40 |
| 7,259,390 B2 * | 8/2007 | Hanna et al. | 257/40 |
| 2004/0248338 A1 * | 12/2004 | Sirringhaus et al. | 438/99 |
| 2005/0127354 A1 * | 6/2005 | Hanna et al. | 257/40 |

FOREIGN PATENT DOCUMENTS

| | | | |
|---|---|---|---|
| EP | 1489141 | * | 12/2004 |
| WO | WO 03/007397 | * | 1/2003 |
| WO | WO 03080732 | * | 10/2003 |

OTHER PUBLICATIONS

Y.-Y. Lin, et al., "Stacked Pentacene Layer Organic Thin-Film Transistors with Improved Characteristics", IEEE Electron Device Lett., Dec. 1997, pp. 606-608, vol. 18, No. 12.

(Continued)

*Primary Examiner*—Shean C Wu
(74) *Attorney, Agent, or Firm*—Ladas & Parry LLP

(57) ABSTRACT

The main object of the invention is to provide an organic semiconductor material whose material designing is easy, and is capable to secure satisfying purity, so that it can be easily used industrially. And further, also to provide an organic semiconductor structure and an organic semiconductor device using the organic semiconductor material.

To achieve the object, the present invention provides an organic semiconductor material having a structural formula of the following chemical formula 1:

$$-((A)-(B))_n- \qquad 1$$

wherein A is a mesogen exhibiting liquid crystallinity; has a skeletal structure comprising a $\pi$-electron ring selected from a group consisting of L-unit of $6\pi$-electron system ring, M-unit of $8\pi$-electron system ring, N-unit of $10\pi$-electron system ring, O-unit of $12\pi$-electron system ring, P-unit of $14\pi$-electron system ring, Q-unit of $16\pi$-electron system ring, R-unit of $18\pi$-electron system ring, S-unit of $20\ \pi$-electron system ring, T-unit of $22\pi$-electron system ring, U-unit of $24\pi$-electron system ring and V-unit of $26\pi$-electron system ring (whereupon L, M, N, O, P, Q, R, S, T, U and V each represent an integer of 0 to 12, and $L+M+N+O+P+Q+R+S+T+U+V$ is 1 to 12); B has a chain structure with high flexibility; and n is about 3 to about 3000.

11 Claims, 1 Drawing Sheet

OTHER PUBLICATIONS

D. Adam, et al., "Transient Photoconductivity in a Discotic Liquid Crystal", Phys. Rev. Lett., Jan. 1993, pp. 457-460, vol. 70, No. 4.

M. Funahashi, et al., "Photoconductive Behavior in Smectic A Phase of 2-(4'-Heptyloxyphenyl)-6-Dodecylthiobenzothiazole", Jpn. J. Appl. Phys., Jun. 1996, pp. 703-705, vol. 35, Pt. 2, No. 6A.

M. Redecker, et al; "Mobility enhancement through homogeneous nematic alignment of a liquid-crystalline polyfluorene" Applied Physics Letters, vol. 74, No. 10, Mar. 8, 1999, pp. 1400-1402.

* cited by examiner

ORGANIC SEMICONDUCTOR MATERIAL, ORGANIC SEMICONDUCTOR STRUCTURE, AND ORGANIC SEMICONDUCTOR DEVICE

BACKGROUND OF THE INVENTION

1. Field of the Invention

The present invention relates to a polymeric organic semiconductor material having liquid crystallinity, an organic semiconductor structure and an organic semiconductor device formed from the organic semiconductor material.

2. Description of the Related Art

As a typical example of an element of an organic semiconductor device, a thin-film transistor (also called organic TFT) using an organic semiconductor as an active layer (hereinafter, referred to as an organic semiconductor layer) can be mentioned.

In this thin-film transistor, the organic semiconductor layer is formed by vacuum deposition process from molecular crystals represented by pentacene. It is reported that in a method of forming an organic semiconductor layer by vacuum deposition process, an organic semiconductor layer having high charge carrier mobility, which is greater than 1 $cm^2/V \cdot s$, can be obtained by optimizing film-manufacturing conditions (for example, see Y.-Y. Lin, D. J. Gundlach, S. Nelson, and T. N. Jackson, "Stacked Pentacene Layer Organic Thin-Film Transistors with Improved Characteristics", IEEE Electron Device Lett., 18, 606 (1997)). However, generally in the organic semiconductor layer formed by the above-mentioned vacuum deposition process, a large number of grain boundaries easily occur in polycrystal state of aggregated fine crystals, and further, defects easily occur so that such grain boundaries and defects inhibit transportation of charge carrier. Accordingly, when an organic semiconductor layer is to be formed by vacuum deposition process, it is actually very difficult to form an organic semiconductor layer serving as an element of an organic semiconductor device continuously with uniform performance over a sufficiently broad area.

On the other hand, a discotic liquid crystal is known as a material showing high charge carrier mobility (for example, see D. Adam, F. Closss, T. Frey, D. Funhoff, D. Haarer, H. Ringsdorf, P. Schunaher, and K. Siemensmyer, Phys. Rev. Lett., 70,457 (1993)). In this discotic liquid crystal, however, carrier transportation is performed based on 1-dimensional charge carrier transport mechanism along column-shaped molecular alignment. Thus, there is a problem that it is difficult to apply industrially because strict control of molecular alignment is required. Up to now, there is no report on a successful example of a thin-film transistor using the discotic liquid crystal as a material of an organic semiconductor device.

It has been reported that a rod-shaped liquid crystalline material such as a phenyl benzothiazole derivative also shows high charge carrier mobility in a liquid crystal phase (for example, see M. Funahashi and J. Hanna, Jpn. J. Appl. Phys., 35, L703-L705 (1996)). However, there is still no report on a successful example of a thin-film transistor using the rod-shaped liquid crystalline material in an organic semiconductor layer. The rod-shaped liquid crystalline material occurs in several liquid crystal phases, and as the structural regularity of the liquid crystalline material is increased, the mobility of charge tends to be increased. However, when this material turns into a crystal phase of higher structural regularity, the mobility of charge is reversely decreased or not observed, thus naturally failing to exhibit the performance of a thin-film transistor.

To utilize the liquid crystalline material in a liquid crystal phase showing high charge carrier mobility, encapsulation thereof into a glass cell is necessary. Thus, there are restrictions in respect of device manufacturing. Further, such rod-shaped liquid crystalline material shows liquid crystallinity at relatively high temperatures so that it cannot be utilized in the vicinity of room temperature (around −10 to 40° C.).

When a polymer material in a molecular dispersion system is used as an organic semiconductor material, an organic semiconductor layer, which having uniform charge carrier transfer property over a large area, can be formed by coating this organic semiconductor material. However, the charge carrier mobility of the resulting organic semiconductor layer is as low as $10^{-5}$ to $10^{-6}$ $cm^2/V \cdot s$, and is problematic because of its dependence on temperature and electric field.

To solve these problems, the present inventors have provided, in a previously filed application, an organic semiconductor structure having an organic semiconductor layer comprising at least partially an aligned liquid crystalline organic semiconductor material, wherein: the liquid crystalline organic semiconductor material has a core containing L-units of $6\pi$-electron system aromatic ring, M-units of $10\pi$-electron system aromatic ring, and N-units of $14\pi$-electron system aromatic ring whereupon L, M and N each represent an integer of 0 to 4, and L+M+N=1 to 4; and having at least one kind of liquid crystal phase at its thermal decomposition temperature or lower.

However, the above-described organic semiconductor structure is formed from a liquid crystalline organic semiconductor material that is a non-polymer material, and with respect to the organic semiconductor material that is a polymer material, there is only the following example, and no effective organic semiconductor material has been found. And neither organic semiconductor structure nor organic semiconductor layer having effective charge carrier transfer property has been reported.

That is, a polymeric semiconductor material having high charge carrier mobility in the vicinity of room temperature has been reported conventionally, for example, by M. Redecker and D. D. C. Bradley (see M. Redecker and D. D. C. Bradley, Applied Physics Letters, vol. 74, 10, (1999)). It is reported in this literature that by using a polymer material having a long conjugated system as its main chain, heating this polymer material to a temperature at which it exhibits a nematic phase, and then quenching to torn a glassy polymer material wherein the nematic phase is fixed, a polymeric semiconductor material having high charge carrier mobility can be obtained. Particularly, it is reported therein that high mobility can be attained when the material is subjected to the above-described operation under a condition of being contacted with an alignment layer subjected to a rubbing treatment by rubbing a polyimide film.

Among the conventional materials described above, the carrier transport material or organic semiconductor material comprising a straight-chain-type polymer has been examined for industrial use by virtue of excellent coating property. To allow such carrier transport material or organic semiconductor material to exhibit high carrier transport ability, it is desirable that intermolecular hopping conduction subsidiarily occurs as well as mainly occurrence of intramolecular charge transportation in the main chain direction. Accordingly, intramolecular skeleton parts in the material are desirably conjugated with one another, which however gives rise to a problem of a limit to design of the material.

Moreover, to secure stability and reliability such as sufficient electrical property and longevity of the organic semiconductor element or the organic semiconductor structure, it is essential that the material forming the organic semiconductor element and the organic semiconductor structure are refined to desired purity. However, in the charge transport material and organic semiconductor material comprising a polymer, deriving from the polymer material structure, there are some limitations (for example, solubility, melting point, boiling point etc.) in means of purification. Therefore, there is a problem that industrially satisfying purity cannot always be secured in many cases.

Further, variation in degree of polymerization of the polymer material forming the organic semiconductor element and the organic semiconductor structure is an undesirable factor because it gives variations in property of the organic semiconductor element and the organic semiconductor structure. However, it is generally difficult to obtain a polymer material with a certain molecular weight, and is problematic from an industrial viewpoint.

The present invention has solved the problems described above. The object of the present invention is to provide an organic semiconductor material whose material designing is easy, and is capable to secure satisfying purity, so that it can be easily used industrially. And further, also to provide an organic semiconductor structure and an organic semiconductor device using the organic semiconductor material.

Up to now, it has not been known that a polymer material having a conjugated system molecule in its main chain, whose conjugation being cut, exhibits high charge carrier mobility. The reason such polymer material does not exhibit high charge carrier mobility is that, in a polymer material having a long conjugated system in its main chain, electron conduction occurs along its main chain, while in a polymer material merely having a short conjugated system in its main chain, charge is transferred by intermolecular hopping conduction because the conjugated systems among the molecules are overlapped. Conventionally, a material, which is capable to control the overlap of the short conjugated systems in main chains is, not known, and high charge carrier mobility could not be attained.

SUMMARY OF THE INVENTION

To achieve the object, as a result of extensive study, the present inventors have found that, even if the conjugated system is interrupted in a molecule, by utilizing the hopping conduction among adjacent molecules which is brought about by an aggregated state derives from liquid crystallinity, high-speed charge transport ability can be realized macroscopically.

That is, the organic semiconductor material of the present invention is obtained as the result of extensive study based on the above finding, which is an organic semiconductor material having a structural formula of the following chemical formula 1:

  1 wherein A is a mesogen exhibiting liquid crystallinity, and has a skeletal structure comprising a π-electron ring selected from a group consisting of L-unit of 6π-electron system ring, M-unit of a 8π-electron system ring, N-unit of 10π-electron system ring, O-unit of 12π-electron system ring, P-unit of 14π-electron system ring, Q-unit of 16π-electron system ring, R-unit of 18π-electron system ring, S-unit of 20π-electron system ring, T-unit of 22π-electron system ring, U-unit of 24π-electron system ring and V-unit of 26π-electron system ring (whereupon L, M, N, O, P, Q, R, S, T, U and V each represent an integer of 0 to 12, and L+M+N+O+P+Q+R+S+T+U+V is 1 to 12); B has a chain structure with high flexibility; and n is about 3 to about 3000.

According to the present invention, vainly increase of the molecular weight is not necessary to attain high-speed charge transport ability. Therefore, design of the material is easy and purity can be easily secured by purification of the material. Moreover, the organic semiconductor material according to the present invention is excellent in process ability, such as coating property, as compared with conventional low-molecular materials, because of the presence of B in the formula which bonds plurality of the skeletal structures, consisting of A in the formula, with each other. As an embodiment of the present invention, when the organic semiconductor material is a copolymerized polymer compound having a plurality of structures of the chemical formula 1, it is preferable that A's in each monomer of the copolymerized polymer compound are composed of the same π-electron system ring. However, A's may be composed of different π-electron system rings. When A's are composed of different π-electron system rings, the energy levels of the respective π-electron system rings involved in charge transportation shall be of similar degree.

In the present invention, the above-mentioned organic semiconductor material is characterized in having at least one kind of thermotropic liquid crystal phase at a temperature not higher than a thermal decomposition temperature thereof. Also, characterized in that the thermotropic liquid crystal phase is a smectic liquid crystal phase. The organic semiconductor material having at least one kind of thermotropic liquid crystal phase at a temperature not higher than the thermal decomposition temperature thereof is referred to hereinafter as "organic semiconductor material I".

In the present invention, the above-mentioned organic semiconductor material is characterized in having at least one kind of lyotropic liquid crystal phase. The organic semiconductor material having at least one kind of lyotropic liquid crystal phase is referred to hereinafter as "organic semiconductor material II".

To achieve the object, the organic semiconductor structure of the invention is an organic semiconductor structure having an organic semiconductor layer comprising the organic semiconductor material I, wherein the organic semiconductor layer has a liquid crystal glassy state, and is formed by keeping the organic semiconductor material at a temperature at which it exhibits a thermotropic liquid crystal phase and then rapidly cooling it from the temperature.

To achieve the object, the organic semiconductor structure of another embodiment of the invention is an organic semiconductor structure having an organic semiconductor layer comprising the organic semiconductor material I, wherein the organic semiconductor layer has a crystal state at least partially, and is formed by keeping the organic semiconductor material at a temperature at which it exhibits a thermotropic liquid crystal phase and then gradually cooling it from the temperature.

To achieve the object, the organic semiconductor structure of another embodiment of the invention is an organic semiconductor structure having an organic semiconductor layer comprising the organic semiconductor material II, wherein the organic semiconductor layer has a good alignment state, and is formed by keeping the organic semiconductor material at a concentration at which it exhibits a lyotropic liquid crystal phase and then gradually removing a solvent.

In the present invention, the above-mentioned organic semiconductor structure of each embodiment is characterized in that the organic semiconductor layer is formed under condition of being contacted to a liquid crystal alignment layer.

According to the present invention, since the organic semiconductor layer is formed in such a state as to contact with the liquid crystal alignment layer, the organic semiconductor structure is excellent in charge transport property based on molecular alignment.

In the present invention, the above-mentioned organic semiconductor structure of the present invention is characterized by at least one of the following: (1) the liquid crystal alignment layer comprises a material selected from a group consisting of polychloropyrene, polyethylene terephthalate, polyoxymethylene, polyvinyl chloride, polyvinylidene fluoride, cyanoethyl pullulan, polymethyl methacrylate, polysulfone, polycarbonate and polyimide, and the organic semiconductor material constituting the organic semiconductor layer is aligned anisotropically, in a specific direction, by contacting with the liquid crystal alignment layer; (2) the liquid crystal alignment layer comprises a curing resin having minute unevenness on the surface thereof, and the organic semiconductor material constituting the organic semiconductor layer is aligned anisotropically, in a specific direction, by contacting with the liquid crystal alignment layer; (3) the liquid crystal alignment layer comprises a base material and a curing resin having minute unevenness on the surface thereof, and the organic semiconductor material constituting the organic semiconductor layer is aligned anisotropically, in a specific direction, by contacting with the liquid crystal alignment layer; and (4) the organic semiconductor material constituting the organic semiconductor layer is aligned anisotropically in a direction wherein the overlapping direction of electron orbitals of a skeletal structure comprising a π-electron ring agrees with a charge transfer direction.

In the present invention, the above-mentioned organic semiconductor structure of each embodiment is characterized in that the organic semiconductor layer has an electron mobility of $10^{-5}$ cm$^2$/V·s or higher, or a hole transport mobility of $10^{-5}$ cm$^2$/V·s or higher.

To achieve the object, the organic semiconductor device of the present invention comprises at least a substrate, a gate electrode, a gate-insulating layer, an organic semiconductor layer, a drain electrode, and a source electrode, wherein the organic semiconductor layer is formed from the above-described organic semiconductor material of the present invention. And is characterized in that the organic semiconductor layer has an electron mobility of $10^{-5}$ cm$^2$/V·s or higher, or a hole transport mobility of $10^{-5}$ cm$^2$/V·s or higher.

In the present invention, the organic semiconductor device is used as an organic transistor, an organic EL element, an organic electronic device or an organic solar battery.

As described above, the organic semiconductor material of the present invention is a polymer organic semiconductor material having, in its main chain, mesogens exhibiting liquid crystallinity, and a structure in which the π conjugated system of the main chain is interrupted. And thus, ccarrier transportation along the main chain does not occur, but charge transport ability can be exhibited by hopping conduction utilizing the liquid crystallinity.

The organic semiconductor material of the present invention preferably has a high-order smectic phase wherein cores consisting of π-electron system rings of adjacent molecules are aggregated with high regularity, so that charge transport ability at higher speed can be expected. That is, when the polymer compound having a skeletal structure comprising π-electron system rings in the main chain, such as the organic semiconductor material of the present invention, is used as an organic semiconductor material, the π-electron system rings constituting the main chain can interact mutually because of the degree of freedom of the stereostructure of the polymer compound. Particularly, in the present invention, the organic semiconductor material exhibiting a smectic phase of high-order structure can form an organic semiconductor layer having very high crystallinity, and thus, it is advantageous in formation of an organic semiconductor structure showing higher charge carrier transfer property. Further, the organic semiconductor material can be coated as it is because it has fluidity at a temperature where it maintains a liquid crystal phase. As the result, an organic semiconductor layer and an organic semiconductor device having high charge carrier transfer property can be formed uniformly with a large area.

Since high-speed charge carrier transportation, by broadening the π-conjugated system of the main chain, is not essentially required in the organic semiconductor material of the present invention, higher molecular weight is not required. As the result, there are advantages that the material can be easily purified to secure sufficient purity and can be easily utilized in industry.

The organic semiconductor material of the present invention has chain structural parts for linking cores with one another. Thus, the material has fundamentally high affinity for solvent, resulting in excellent processability such as coating. Accordingly, unlike polymer organic semiconductor materials of π conjugated linear chain type, the organic semiconductor material of the present invention has the advantage of less restriction in structure such as: a side chain should be added to improve processability; and the direction of the side chain should be fixed to maintain planarity in order to improve electrical property.

The organic semiconductor material of the present invention may be a copolymerized polymer compound. However, the cores possessed by mesogens contained in the main chain are preferably composed of the same π-electron system ring. Also, the cores possessed by mesogens contained in the main chain may be different, but in this case, the energy levels involved in charge transportation are preferably similar.

Since the organic semiconductor structure of the present invention is provided with an organic semiconductor layer comprising the organic semiconductor material of the present invention, charge transport ability can be exhibited by hopping conduction utilizing mesogens exhibiting liquid crystallinity. Further, since the organic semiconductor layer is formed from the polymer organic semiconductor material excellent in processability such as coating, an organic semiconductor layer having high charge carrier transfer property can be formed uniformly with a large area. As the result, the organic semiconductor material of the invention is advantageous in production of an organic semiconductor structure and an organic semiconductor device.

DESCRIPTION OF THE PREFERRED EMBODIMENTS

Figure 1:
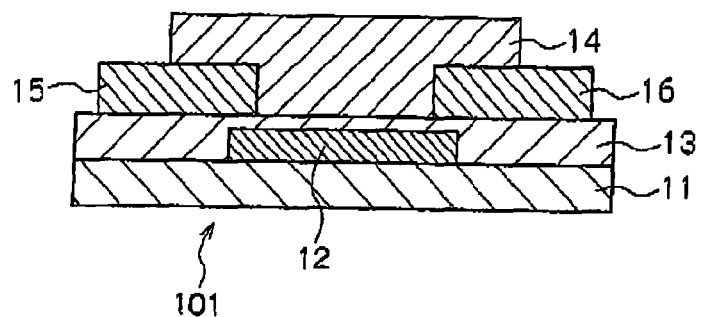
FIG. 1 is a sectional view showing one example of the organic semiconductor device of the present invention.

Hereinafter, the organic semiconductor material, the organic semiconductor structure and the organic semiconductor device of the present invention are described.

<Organic Semiconductor Material>

The organic semiconductor material of the present invention is an organic semiconductor material having the structural formula of chemical formula 1, and a mesogen (expressed as A in the formula), exhibiting liquid crystallinity in the main chain, has a skeletal structure comprising predetermined π-electron rings. In one embodiment of the present invention, oven though the organic semiconductor material is a copolymerized polymer compound having a plurality of structures of the chemical formula 1, A's in the respective monomers of the copolymerized polymer compound are preferably composed of the same π-electron system ring.

First, the skeletal structure constituting A in chemical formula 1 is described. The skeletal structure is selected from a group consisting of L-unit of 6π-electron system ring, M-unit of 8π-electron system ring, N-unit of 10π-electron system ring, O-unit of 12π-electron system ring, P-unit of 14π-electron system ring, Q-unit of 16π-electron system ring, R-unit of 18π-electron system ring, S-unit of 20π-electron system ring, T-unit of 22π-electron system ring, U-unit of 24π-electron system ring and V-unit of 26π-electron system ring. In the organic semiconductor material of the present invention, L, M, N, O, P, Q, R, S, T, U and V each represent an integer of 0 to 12, and L+M+N+O+P+Q+R+S+T+U+V is 1 to 12.

Specifically, the 6π-electron system ring includes, for example, a benzene ring, furan ring, thiophene ring, pyrrole ring, 2H-pyran ring, 4H-thiopyran ring, pyridine ring, oxazole ring, isoxazole ring, thiazole ring, isothiazole ring, furazane ring, imidazole ring, pyrazole ring, pyrazine ring, pyrimidine ring and pyridazine ring. The 8π-electron system ring includes, for example, a pentalene ring, indene ring, indolizine ring and 4H-quinoline ring. The 10π-electron system ring includes, for example, a naphthalene ring, azulene ring, benzofuran ring, isobenzofuran ring, 1-benzothiophene ring, 2-benzothiophene ring, indole ring, isoindole ring, 2H-chromene ring, 1H-2-benzopyran ring, quinoline ring, isoquinoline ring, 1,8-naphthyridine ring, benzimidazole ring, 1H-indazole ring, benzoxazole ring, benzothiazole ring, quinoxaline ring, quinazoline ring, cinnoline ring, pteridine ring, purine ring and phthalazine ring. The 12π-electron system ring includes, for example, a heptalene ring, biphenylene ring, as-indacin ring, s-indacin ring, acenaphthylene ring, fluorene ring and phenalene ring. The 14π-electron system ring includes, for example, a phenanthrene ring, anthracene ring, carbazole ring, xanthene ring, acridine ring, phenanthridine ring, pyrimidine ring, 1,10-phenanthroline ring, phenazine ring, phenarsazine ring and tetrathiafulvalene ring. The 16π-electron system ring includes, for example, a fluoranthene ring, acephenanthrylene ring, aceanthrylene ring, pyrene ring, thianthrene ring, phenoxathiine ring, phenoxazine ring and phenothiazine ring. The 18π-electron system ring includes, for example, a triphenylene ring, chrysene ring, naphthacene ring and pleiadene ring. The 20π-electron system ring includes, for example, a perylene ring, and the 22π-electron system ring includes, for example, a piceine ring, pentaphene ring and pentacene ring. The 24π-electron system ring includes, for example, a tetraphenylene ring and coronene ring. The 26π-electron system ring includes, for example, a hexaphene ring, hexacene ring and rubicene ring.

A skeletal structure having these π-electron system rings as a part of the structure includes, for example, structures shown in the following chemical formulae 2 to 36:

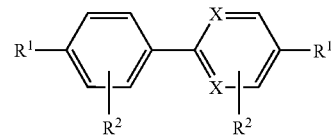

2

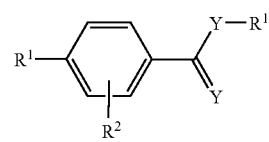

3

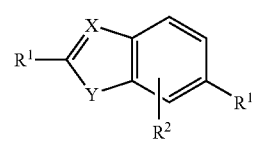

4

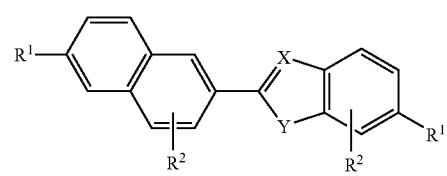

5

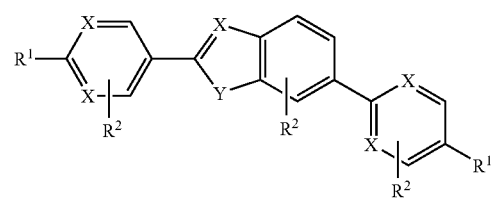

6

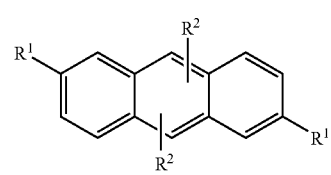

7

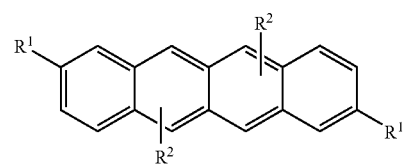

8

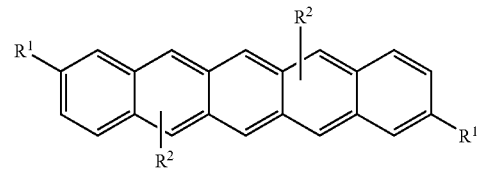

9

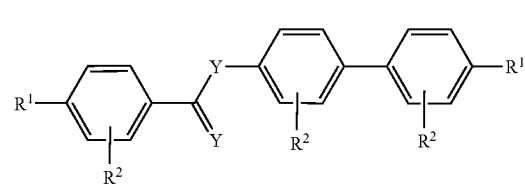

10

-continued

-continued

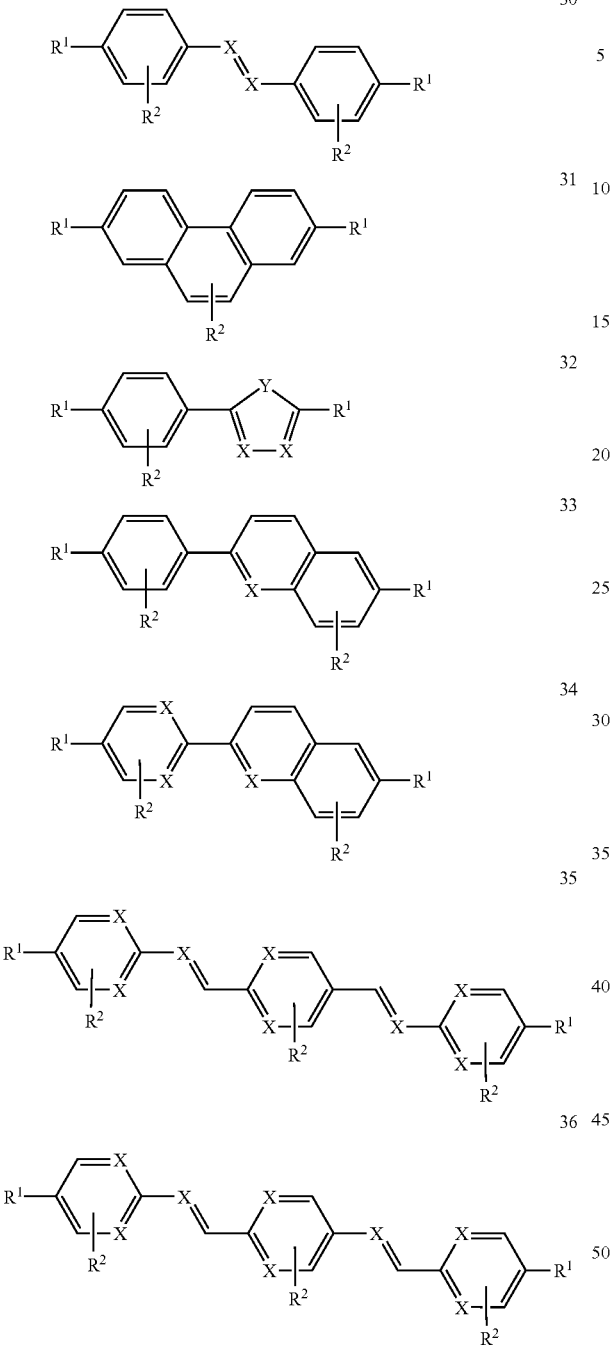

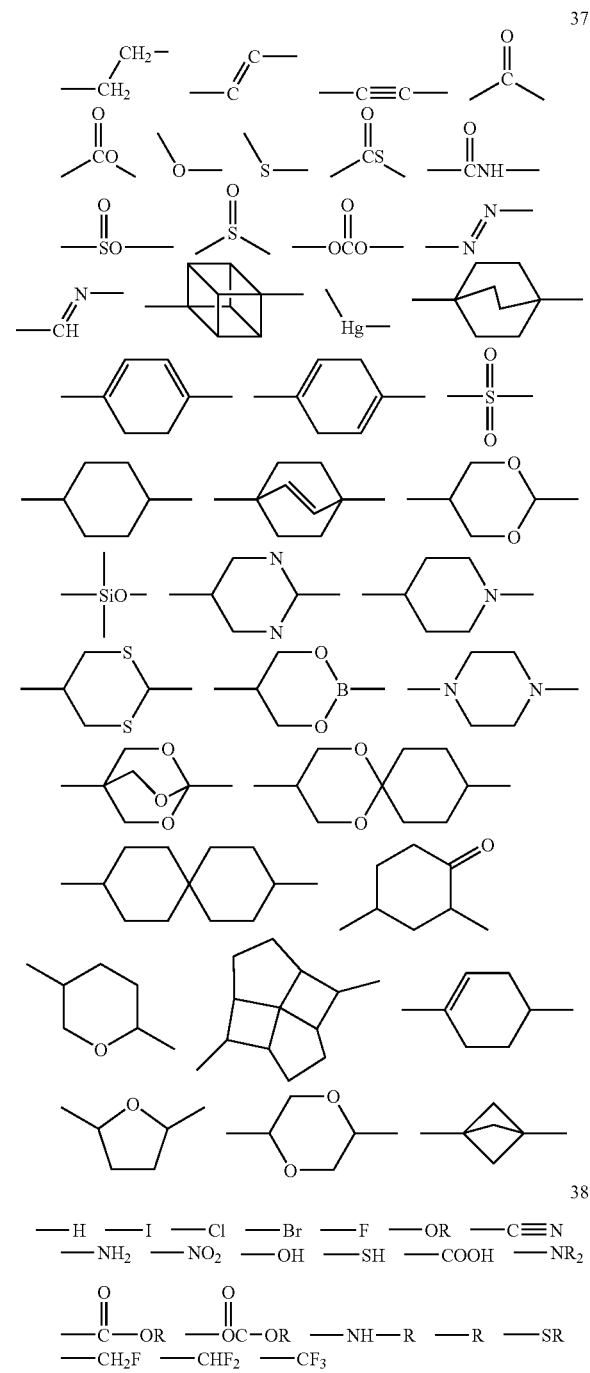

$R^1$ in the formulae 2 to 36 represents a divalent structure shown in formula 37 below, which is a linking group for linking with another skeleton. When a plurality of $R^1$'s are present in these liquid crystal molecules, the $R^1$'s may be the same or different. $R^1$ may not be present in the liquid crystal molecules. $R^2$ in the formulae 2 to 36 represents a functional group shown in formula 38 below. When a plurality of $R^2$'s are present in these liquid crystal molecules, the $R^2$'s may be the same or different. X in the formulae 2 to 36 represents CH or N, and Y in the formulae 2 to 36 represents S or O. R in the formula 38 is a C1 to C40 linear or branched alkyl group.

Next, the structure of B in chemical formula 1 is described.

B has a chain structure with high flexibility. The chain structure with high flexibility is basically a linear alkyl chain or branched alkyl chain, and this alkyl chain may contain a structure selected from the group of 39 divalent structures shown in chemical formula 37. The chain structure with high flexibility may be consisting of structures selected from the group of 39 divalent structures shown in chemical formula 37. In this case, the chain structure with high flexibility may be composed of one structure selected from the group, or may be composed of a plurality of structures linked in a linear or branched form, which are selected from the group. These chain structures with high flexibilitys may have a functional group selected from the group of 21 functional groups illustrated as substituent groups in chemical formula 38. The chain structure with high flexibility has a linear or branched structure, and is composed of the divalent structure(s) of chemical formula 37. As such substituents, 21 structures shown in chemical formula 38 can be exemplified, and each substituent may be the same or different.

In the liquid crystal polymer organic semiconductor material having such A and B as the structural skeleton, high-speed charge transport ability is not required to be obtained by increasing the molecular weight vainly. Therefore, design of the material is easy and purity can be easily secured by purification of the material. Because of the presence of B in the formula, which bonds the skeletal structures comprising A in the formula to each other, the organic semiconductor material is excellent in processability such as coating property, as compared with conventional low-molecular materials. When the organic semiconductor material is a copolymerized polymer compound having a plurality of structures of the chemical formula 1, A's in the respective monomers in the copolymerized polymer compound are preferably composed of the same π-electron system ring. However, they may be composed of different π-electron system rings. When A's are composed of different π-electron system rings, the energy level of each π-electron system ring involved in charge transportation is preferably a similar degree.

Now, the properties of the liquid crystalline organic semiconductor material are described.

The organic semiconductor material of the present invention can be divided into an organic semiconductor material having at least one kind of thermotropic liquid crystal phase at a temperature of not higher than the thermal decomposition temperature thereof (referred to as organic semiconductor material I) and an organic semiconductor material having at least one kind of lyotropic liquid crystal phase (referred to as organic semiconductor material II). The thermotropic liquid crystal (thermotropic LC) is a substance that turns to liquid crystal in a certain temperature range, and in the present invention, the thermotropic liquid crystal includes smectic liquid crystals and nematic liquid crystals, depending on a difference in molecular arrangement. The lyotropic liquid crystal (also called lyotropic LC) turns to liquid crystal in presence of a solvent, and its phase transition occurs due to local existence of 2 moieties having conflicting affinity for solvent with each other. The phase transition of the lyotropic liquid crystal may occur upon a change in concentration, without depending on temperature, and is also called concentration transition-type liquid crystal.

The liquid crystalline polymer organic semiconductor material of the present invention has at least one kind of thermotropic liquid crystal phase at a temperature of not higher than the thermal decomposition temperature thereof. The phrase "at a temperature of not higher than the thermal decomposition temperature thereof" means that the material is in such a state that the material itself is not thermally decomposed. The thermal decomposition temperature varies depending on the material used. The phrase "at least one kind of thermotropic liquid crystal phase" means that a material having at least one kind of thermotropic liquid crystal phase is used. Among the thermotropic liquid crystals, smectic (hereinafter, also referred to as Sm) liquid crystals described later, for example, have plural kinds of liquid crystal phases such as SmA phase, SmB phase, SmC phase, SmD phase, etc., and the material referred to the above is meant to have at least one of such liquid crystal phases.

Particularly, in the present invention, the organic semiconductor material exhibiting a smectic phase of high-order structure can form an organic semiconductor layer having extremely high crystallinity. Thus, it is advantageous in formation of an organic semiconductor structure showing higher carrier transfer property. Further, the organic semiconductor material can be coated as it is, because the material has fluidity at a temperature at which it maintains a liquid crystal phase. And then, by forming an organic semiconductor structure by below-described means, an organic semiconductor layer having high charge carrier transfer property can be formed uniformly with a large area.

Moreover, the organic semiconductor material of the present invention may have at least one kind of lyotropic liquid crystal phase.

<Organic Semiconductor Structure>

The organic semiconductor structure of the present invention has an organic semiconductor layer comprising the organic semiconductor material of the above-described present invention. The organic semiconductor layer is formed by the following 3 means.

(First Means)

In the first means, the organic semiconductor layer is formed by keeping the organic semiconductor material I at a temperature where it exhibits a thermotropic liquid crystal phase, and then cooling the material rapidly from the temperature. In the organic semiconductor layer thus formed, a phase (preferably a smectic phase) having a high-order structure (high texture) is fixed in a liquid crystal phase. The organic semiconductor layer thus formed has high charge carrier transfer property. By forming the organic semiconductor layer in a state that the organic semiconductor layer is in contact with a liquid crystal alignment layer, an organic semiconductor structure excellent in charge carrier transport property based on molecular alignment can be obtained.

In the first means, the rate of rapid cooling from the temperature range where the material can maintain or transiently exhibit a smectic liquid crystal phase, for example, is from 50° C. or more/minute to 20° C./minute. The sate of the resulting organic semiconductor structure, whether it is in glassy state or not, can be determined by comparing its texture observed with a polarizing microscope with the texture thereof in a liquid crystal phase.

(Second Means)

In the second means, the organic semiconductor layer is formed by keeping the organic semiconductor material I at a temperature where it can maintain or transiently exhibit a thermotropic liquid crystal phase, and then cooling the material gradually from the temperature. The organic semiconductor layer thus formed has a crystal state, at least partially, to realize high order in a broad range. By gradually cooling the organic semiconductor material, the crystal size of the organic semiconductor material is increased, so that high charge carrier mobility can be obtained. Particularly, when the crystal size is greater than the distance between electrodes that are involved with charge transfer, higher charge carrier mobility can be realized. By forming the organic semiconductor layer in a state that the organic semiconductor layer is in contact with a liquid crystal alignment layer, an organic semiconductor structure excellent in charge carrier transport property based on molecular alignment can be obtained.

In the second means, it is preferable that the organic semiconductor material is aligned by laminating it on; a liquid crystal alignment layer comprising a polyimide-based material; a liquid crystal alignment layer comprising a curing resin having minute unevenness on the surface thereof; or a liquid crystal alignment layer comprising a base material and a curing resin having minute unevenness on the surface thereof.

In the second means, the rate of gradual cooling from the temperature range where the material can maintain or transiently exhibit a smectic liquid crystal phase is, for example, from 10° C./minute to 0.1° C./minute. A gradual cooling rate of less than 0.1° C./minute is inconvenient because the required time is increased, while a gradual cooling rate of higher than 10° C./minute is not preferable because structural defects that affect the charge transportation occur due to rapid volume shrinkage of the crystal phase. Whether a part of the resulting organic semiconductor phase has been crystallized or not can be determined by observing with a polarizing microscope or by X-ray diffraction. The ratio of the crystallized portion is preferably 100 to 80%, and the size of the crystal after crystallization, in terms of average crystal grain size measured with a polarizing microscope, is preferably several tens μm to several hundreds μm.

In both the first and second means described above, the organic semiconductor material can be coated as it is because the material has fluidity at a temperature where the liquid crystal phase is maintained. According to these methods, an organic semiconductor layer of large area, with uniform charge carrier transfer property, can be formed extremely easily. As coating methods in this case, various coating methods and printing methods can be used. In this specification, the liquid crystal phase or crystal state means that the liquid crystalline organic semiconductor material is in an aggregated state of below liquid crystal/crystal phase transition temperature.

(Third Means)

In the third means, the organic semiconductor layer is formed by keeping the organic semiconductor material II at a concentration where it exhibits the lyotropic liquid crystal phase, and then, gradually removing a solvent. The organic semiconductor layer formed in this manner has an excellent alignment state so that alignment in a broad range is realized. By gradually removing a solvent from the organic semiconductor material, high charge carrier mobility can be realized. By forming the organic semiconductor layer in a state being contacted with the liquid crystal alignment layer, an organic semiconductor structure excellent in charge transport property based on molecular alignment can be obtained.

Also in the above-described third means, the organic semiconductor material before solvent removal has fluidity, so that can be coated as it is. According to this method, the organic semiconductor layer of large area, with uniform charge carrier transfer property, can be formed extremely easily. As coating methods, various coating methods and printing methods can be used.

In the organic semiconductor structure of the above-described present invention, an organic semiconductor layer comprising the organic semiconductor material preferably has an electron mobility of $10^{-5}$ cm$^2$/V·s or higher, or a hole transport mobility of $10^{-5}$ cm$^2$/V·s or higher.

(Liquid Crystal Alignment Means)

Since the organic semiconductor layer constituting the organic semiconductor structure of the present invention is formed in a state that the organic semiconductor layer is in contact with the liquid crystal alignment layer, it exhibits excellent alignment state, that is, aligned anisotropically in a specific direction. For example, the organic semiconductor layer in the organic semiconductor structure formed by the above-described second means is formed by gradually cooling the organic semiconductor material aligned anisotropically in a specific direction by an alignment means.

By such liquid crystal alignment means, the organic semiconductor material constituting the organic semiconductor layer can be aligned anisotropically in a direction where the overlapping direction of electron orbitals of a skeletal structure compriaing the π-electron system ring agrees with the charge transport direction.

The alignment means includes a means that involves forming a liquid crystal alignment layer on a surface on which the organic semiconductor material is to be formed (for example, the surface of a gate-insulating layer described later), and then subjecting it to alignment treatment such as rubbing treatment or light irradiation treatment, or a means in which the organic semiconductor material is brought into contact with a layer subjected to an alignment treatment. In such alignment means, the liquid crystal phase of the organic semiconductor material is formed so that it is aligned anisotropically in a specific direction. Therefore, the organic semiconductor layer thus formed can exhibit unique function or electrical property according to the direction of the liquid crystal phase alignment.

In the organic semiconductor structure of the present invention, various liquid crystal alignment layers can be used. However, it is preferable that the liquid crystal alignment layer is one of the following: a layer prepared by coating a polyimide-based material and then subjecting it to rubbing treatment; a layer prepared by coating a polyimide-based material and then subjecting it to light irradiation treatment; a layer comprising a curing resin having minute unevenness; or a layer comprising a curing resin having minute unevenness wherein the liquid crystal alignment layer and the base material are integrated. The liquid crystal alignment layer can be aligned in an external field such as an electric field or a magnetic field.

Particularly, as a typical example of the liquid crystal alignment layer, those prepared by coating a polyimide-based resin and then subjecting to rubbing treatment can be mentioned. Besides this polyimide-based material, the material can include resin materials such as acrylate, polychloropyrene, polyethylene terephthalate, polyoxymethylene, polyvinyl chloride, polyvinylidene fluoride, cyanoethyl pullulan, polymethyl methacrylate, polysulfone, polycarbonate, polyimide and the like. These materials can be classified, depending on their types, into those having an ability to be aligned vertically to the liquid crystal and those having an ability to be aligned horizontally to the liquid crystal. Specific means of coating includes spin coating method, casting method, dipping method, transferring method, ink jet method and the like. Such liquid crystal alignment layer can be disposed in between a substrate and the organic semiconductor layer, or on an overcoat layer on the organic semiconductor layer.

The layer comprising a curing resin having minute unevenness can be formed, for example, by forming a layer comprising a curing resin and then rubbing the surface of the layer, or by depressing a shaping member, capable of forming minute unevenness, onto the surface of the curing resin which is not yet cured and then curing the resin layer. The surface of the cured resin thus obtained has minute unevenness formed thereon, so that the liquid crystal phase of the organic semiconductor material can be aligned in that direction. As the curing resin, acrylic UV-curing resin, fluorine-based UV-curing resin and the like can be listed. It is particularly preferable that the liquid crystal alignment layer comprising the cured resin having minute unevenness is formed as an integrated body with a substrate.

The minute unevenness in this case is composed of minute grooves formed in a same direction. The depth of a groove in this unevenness is about 0.0 to 1.0 μm, preferably about 0.03 to 0.3 μm, and the width of the groove is about 0.05 to 1.0 μm, and the pitch between adjacent grooves is about 0.1 to 2.0 μm. When the depth of the groove is less than 0.01 μm, the liquid crystal molecules cannot be correctly aligned, while when the depth is greater than 1.0 μm, the alignment of the liquid crystal may be disturbed at the edge of the groove. When the width of the groove is less than 0.05 μm, the grooves are hardly produced, while when the width is greater than 1.0 μm, the alignment force in the middle of the groove may be lowered. When the pitch among the grooves formed is less than 0.1 μm, the grooves are hardly produced, while when the pitch is greater than 2.0 μm, there easily occurs disturbance in alignment of the liquid crystal.

In the organic semiconductor structure of the present invention, as the first embodiment of the liquid crystal alignment layer, ones having a substrate, the liquid crystal alignment layer and the organic semiconductor layer laminated in this order can be mentioned. As the second embodiment of the liquid crystal alignment layer, ones having a substrate, the organic semiconductor layer and the liquid crystal alignment layer laminated in this order can be mentioned. As the third embodiment of the liquid crystal alignment layer, ones having a substrate, the liquid crystal alignment layer, the organic semiconductor layer and the liquid crystal alignment layer laminated in this order can be mentioned. In the present invention, as described above, since the organic semiconductor layer is constituted so as to be contacted with the layer subjected to alignment treatment, the liquid crystal phase constituting the organic semiconductor material can be imparted with high alignment property.

<Organic Semiconductor Device>

As shown in FIG. 1, the organic semiconductor device 101 of the present invention is composed of at least substrate 11, gate electrode 12, gate-insulating layer 13, organic semiconductor layer 14, drain electrode 15 and source electrode 16. In the organic semiconductor device 101, the organic semiconductor layer 14 is formed from the organic semiconductor material constituting the organic semiconductor structure of the above-described present invention.

Examples of the constitution include: a reverse-staggered structure constituted of, on the substrate 11, the gate electrode 12, gate-insulating layer 13, aligned organic semiconductor layer 14, drain electrode 15, source electrode 16 and protective layer 17 in this order; and a coplanar structure constituted of, on the substrate 11, the gate electrode 12, gate-insulating layer 13, drain electrode 15, source electrode 16, organic semiconductor layer 14 and a protective layer (not shown in the figure) in this order. The organic semiconductor device 101 thus constituted is actuated in either one of an accumulated and empty state, depending on the polarity of voltage applied to the gate electrode 12. Hereinafter, the members constituting the organic semiconductor device are described in detail.

(Substrate)

The substrate 11 can be selected from a wide variety of insulating materials. Examples of such materials include: inorganic materials such as glass and calcined alumina; and various kinds of insulating materials such as polyimide film, polyester film, polyethylene film, polyphenylene sulfide film and polyparaxylene film. Particularly, a film comprising a polymer compound is extremely useful because it can be used to produce a light weight and flexible organic semiconductor device. The thickness of substrate 11 used in the present invention is about 25 μm to 1.5 mm.

(Gate Electrode)

The gate electrode 12 is preferably an electrode consisting of an organic material such as polyaniline, polythiophene etc., or an electrode formed by coating conductive ink. Since these electrodes can be formed by coating organic material or the conductive ink, there is an advantage that the electrode formation process is very easy. Specific means of coating includes spin coating method, casting method, pulling method, transferring method, ink jet method, etc.

When forming a metallic film as the electrode, conventional vacuum film deposition method can be used. Specifically, a mask film-forming method or photolithography can be used. In this case, the following can be used as material for forming electrodes: metals such as gold, platinum, chromium, palladium, aluminum, indium, molybdenum, nickel and the like; alloys of these metal; and inorganic materials such as polysilicon, amorphous silicon, tin oxide, indium oxide, indium tin oxide (ITO) and the like. Two or more of these materials can be simultaneously used.

The thickness of the gate electrode is preferably about 50 to 1000 nm depending on the electric conductivity of its material. The lower limit of thickness of the gate electrode varies according to the electric conductivity of the electrode material and adhesion to a bedding substrate. The upper limit of thickness of the gate electrode should be in such a range that, upon providing the below-mentioned gate-insulating layer and a pair of source/drain electrodes, insulating coverage by the gate-insulating layer at a portion with a level difference, between the bedding substrate and the gate electrode, is sufficient. Also, it is necessary that an electrode pattern formed thereon should not be disconnected. Particularly, when a flexible substrate is used, stress balance should be taken into consideration.

(Gate-Insulating Layer)

The gate-insulating layer 13 is, similar to the gate electrode 12 described above, preferably formed by coating the organic material. As the organic material to be used, polychloropyrene, polyethyleneterephthalate, polyoxymethylene, polyvinyl chloride, polyvinylidene fluoride, cyanoethyl pullulan, polymethylmethacrylate, polysulfone, polycarbonate, polyimide and the like can be listed. Specific means of coating includes spin coating method, casting method, pulling method, transferring method, ink jet method and the like. The gate-insulating layer may be formed by conventional patterning process such as CVD method. In this case, inorganic materials such as $SiO_2$, $SiN_x$ and $Al_2O_3$ are preferably used. Two or more of these materials can be simultaneously used.

Since the mobility in the organic semiconductor device depends on the strength of an electric field, the thickness of the gate-insulating layer is preferably about 50 to 300 nm. Withstand voltage at the time is desirably 2 MV/cm or higher.

(Drain Electrode and Source Electrode)

The drain electrode 15 and source electrode 16 are preferably formed from metal of high work function. This is because the charge transporting carrier in the liquid crystalline organic semiconductor material described later is a hole, ohmic contact with the organic semiconductor layer 14 is necessary. The work function used herein is a potential difference necessary for taking an electron out of a solid, and is defined as difference in energy between vacuum level and fermi level. The work function is preferably about 4.6 to 5.2 eV, and specific materials include gold, platinum, a transparent conductive film (indium tin oxide, indium zinc oxide, etc.). The transparent conductive film can be formed by sputtering method or electron beam (EB) deposition.

The thickness of the drain electrode 15 and source electrode 16 used in the present invention is about 50 to 100 nm.

(Organic Semiconductor Layer)

The organic semiconductor layer 14 is a layer formed from the organic semiconductor material. Specific examples of the organic semiconductor material, its cooling conditions, alignment treatment, liquid crystal alignment layer and the like are as described above.

The organic semiconductor layer 14 thus formed has a distinctive effect that a defect-free uniform organic semiconductor layer of large area can be formed. Electron transporting speed exhibited by the organic semiconductor layer 14 is preferably $10^{-5}$ cm$^2$/V·s or higher, or hole transporting speed exhibited by this layer is preferably $10^{-5}$ cm$^2$/V·s or higher. Types, conditions and the like of the organic semiconductor material are examined, as required, in order to attain such property values. By allowing the organic semiconductor layer 14 to have such a charge transporting speed, there are advantages that the organic semiconductor layer can contribute, for example, to reduction in driving voltage of an organic thin-film transistor, and to improvement in response speed.

When a surface on which the organic semiconductor material is to be formed is the gate-insulating layer or the substrate, by subjecting the gate-insulating layer or the substrate to rubbing treatment, the alignment treatment film can be formed into an integrated body with the gate-insulating layer or the substrate.

(Interlayer-Insulating Layer)

The organic semiconductor device 101 is desirably provided with an interlayer-insulating layer. When the drain electrode 15 and source electrode 16 are formed on the gate-insulating layer 13, the interlayer-insulating layer is formed for the purpose of preventing pollution of the surface of the gate electrode 12. Accordingly, the interlayer-insulating layer is formed on the gate-insulating layer 13 prior to the formation of the drain electrode 15 and source electrode 16. After the source electrode 15 and drain electrode 16 are formed, the interlayer-insulating layer is processed such that a part of the layer, disposed on the upper channel region, is completely or partially removed. The region of the interlayer-insulating layer to be removed is desirably similar to the size of the gate electrode 12.

The material includes inorganic materials such as SiO$_2$, SiN$_X$ and Al$_2$O$_3$, and organic materials such as polychloropyrene, polyethylene terephthalate, polyoxymethylene, polyvinyl chloride, polyvinylidene fluoride, cyanoethyl pullulan, polymethyl methacrylate, polysulfone, polycarbonate, and polyimide.

(Other Embodiments of the Organic Semiconductor Device)

The organic semiconductor device of the present invention may be constituted with any one of the following: (i) substrate/gate electrode/gate-insulating layer (also serving as an liquid crystal alignment layer)/source-drain electrodes/liquid crystalline organic semiconductor layer (/protective layer); (ii) substrate/gate electrode/gate-insulating layer/source-drain electrodes/liquid crystal alignment layer/liquid crystalline organic semiconductor layer (/protective layer); (iii) substrate/gate electrode/gate-insulating layer (also serving as a liquid crystal alignment layer)/liquid crystalline organic semiconductor layer/source-drain electrodes/(protective layer); (iv) substrate/gate electrode/gate-insulating layer (also serving as a liquid crystal alignment layer)/liquid crystalline organic semiconductor layer/substrate with source-drain electrodes patterned thereon (also serving as a protective layer); (v) substrate/source-drain electrodes/liquid crystalline organic semiconductor layer/gate-insulating layer (also serving as a liquid crystal alignment layer)/gate electrode/substrate (also serving as a protective layer); (vi) substrate (also serving as an alignment layer)/source-drain electrodes/liquid crystalline organic semiconductor layer/gate-insulating layer/gate electrode/substrate (also serving as a protective layer); and (vii) substrate/gate electrode/gate-insulating layer/source-drain electrodes/liquid crystalline organic semiconductor layer/substrate (also serving as an alignment layer).

In these organic semiconductor devices, by using the organic semiconductor material of the present invention, the organic semiconductor layer can be formed easily by a coating system.

EXAMPLES

Hereinafter, the present invention is described in more detail showing an example of the charge transport property of low-molecular-weight and high-molecular-weight compounds having a mesogen of the same skeleton.

<Low-Molecular Liquid Crystalline Organic Semiconductor Containing a Fluorene Skeleton>

(Synthetic Procedure)

A suspension consisting of heptanoyl chloride (49.0 g, 0.33 mol), aluminum chloride (50.0 g, 0.375 mol) and dichloromethane (100 ml) was introduced, in an argon stream, into a 300 mL three-necked flask, and then cooled to 0° C. in an ice bath. Then, a mixed solution consisting of fluorene (24.9 g, 0.15 mol) and dichloromethane (100 ml) was dropped slowly into the suspension, over 2 hours, so that the temperature dose not become 0° C. or more. After dropping is completed, the temperature of the reaction solution was increased to room temperature, and the solution was stirred overnight. After the reaction is completed, the reaction solution exhibiting red color was poured slowly into iced water (300 ml). An organic layer of dichloromethane was separated from an aqueous layer and was cleaned with water until it became neutral. After, drying and concentrating with sodium sulfate, the above was recrystallized with ethyl acetate, whereby the objective product 2,7-diheptanoyl-fluorene, 40.8 g (yield 69.7%), was obtained. The above reaction is shown in the following reaction scheme:

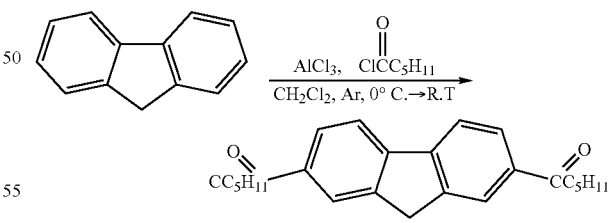

(Phase Series)

By a differential scanning calorimeter (DSC) and a polarizing microscope, it was found that upon decreasing temperature, the phase was transferred from an isotropic phase to a smectic phase A at 160° C., to a smectic phase C at 150° C., and to a crystal phase at 140° C.

(Charge Carrier Mobility Measurement)

Figure 2:
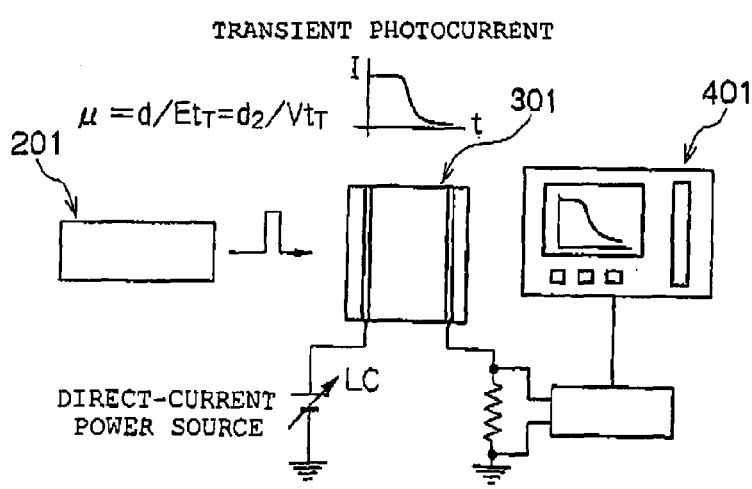
FIG. 2 is a schematic diagram showing transient photocurrent measurement (TOF method).

The resulting low-molecular compound, 2,7-diheptanoyl-fluorene, was placed in a glass cell equipped with an ITO (indium tin oxide) electrode, and charge carrier mobility was measured by transient photo current measurement (TOF method), on a hot plate, with the device shown in FIG. 2. The hole charge carrier mobility was $2\times10^{-4}$ cm$^2$/V·s in the isotropic phase, $8\times10^{-4}$ cm$^2$/V·s in the smectic phase A, and $1\times10^{-3}$ cm$^2$/V·s in the smectic phase C. However, in the crystal phase, only dispersive waveform was obtained, and the charge carrier mobility could not be calculated. In the transient photocurrent measurement, a procedure in which a sample was excited by an N2 pulse laser of a wavelength of 337 nm, was used in this example. In FIG. 2, the reference numeral 201 is the N2 pulse laser, the reference numeral 301 is the sample, and the reference numeral 401 is a digital oscilloscope.

<Synthesis of Fluorene Polymer>

(Synthetic Procedure)

After introducing 0.91 g (5.5 mmol) of fluorene into a 100-ml three-necked flask and flushing with Ar, 15 ml of PPMA (mixture of 360 g (3.75 mol) of methanesulfonic acid and 36 g (0.25 mol) of diphosphorus pentaoxide, which had been stirred for about 2 hours, was used) was added to the three-necked flask, and the mixture was stirred to be dissolved. The mixture was heated to 60° C., and 0.93 g (4.6 mmol) of sebacic acid was added thereto and was stirred for about 4 hours. This reaction solution was poured into 1 L of water cooled in an ice bath and was stirred for about 6 hours. The reaction mixture was filtered with a membrane filter. Residues on the filter were dissolved in guaranteed NMP and reprecipitated with guaranteed acetone. After reprecipitating for two more times with the same solvent, reprecipitations with EL standard NMP and with acetone for 2 more times were conducted. Thus, a polymer compound of the following chemical formula 40 was obtained with a yield of about 1.2 g.

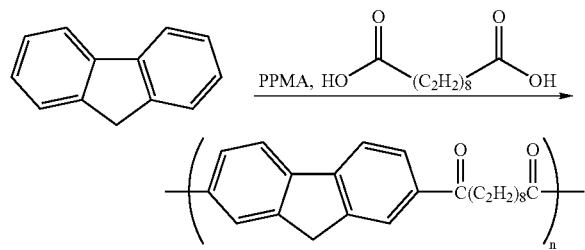

(Phase Series Observation)

In DSC measurement, endothermic peaks were observed at about 105° C., 120° C., 130° C., 140° C. and 145° C. in a temperature rising process, and an exothermic peak was observed only at about 110° C. in a temperature dropping process. When a glass cell introduced with the resulting polymer compound was used to observe its texture with a polarizing microscope, a liquid crystal glassy state of smectic phase was observed at about 110° C. or lower.

(Charge Carrier Mobility Measurement)

The resulting polymer compound, fluorene polymer, was introduced into a glass cell equipped with an ITO (indium tin oxide) electrode and charge carrier mobility was measured by transient photocurrent measurement (TOF method), on a hot plate, as described above. The hole charge carrier mobility was $8\times10^{-3}$ cm$^2$/V·s in the isotropic phase, and $1\times10^{-3}$ cm$^2$/V·s in the liquid crystal glassy state, and this value was also observed at ordinary temperatures (30° C.).

What is claimed is:

1. An organic semiconductor material having a structural formula of the following chemical formula 1:

-((A)-(B))$_n$-    1 wherein A is a mesogen exhibiting liquid crystallinity, and has a skeletal structure comprising a π-electron ring selected from a group consisting of L-unit of 6 π-electron system ring, M-unit of 8 π-electron system ring, N-unit of 10 π-electron system ring, O-unit of 12 π-electron system ring, P-unit of 14 π-electron system ring, Q-unit of 16 π-electron system ring, R-unit of 18 π-electron system ring, S-unit of 20 π-electron system ring, T-unit of 22 π-electron system ring, U-unit of 24 π-electron system ring and V-unit of 26 π-electron system ring (whereupon L, M, N, O, P, Q, R, S, T, U and V each represent an integer of 0 to 12, and L+M+N+O+P+Q+R+S+T+U+V is 1 to 12); B has a chain structure with high flexibility; and n is about 3 to about 3000, and further wherein the organic semiconductor material has at least one kind of lyotropic liquid crystal phase.

2. An organic semiconductor structure having an organic semiconductor layer comprising the organic semiconductor material according to claim 1, wherein the organic semiconductor layer has an alignment state, and is formed by keeping the organic semiconductor material at a concentration at which it exhibits a lyotropic liquid crystal phase and then gradually removing a solvent.

3. The organic semiconductor structure according to claim 2, wherein the organic semiconductor layer is formed under condition of being contacted to a liquid crystal alignment layer.

4. The organic semiconductor structure according to claim 3, wherein the liquid crystal alignment layer comprises a material selected from a group consisting of polychloropyrene, polyethylene terephthalate, polyoxymethylene, polyvinyl chloride, polyvinyl idene fluoride, cyanoethyl pullulan, polymethyl methacrylate, polysulfone, polycarbonate and polyimide, and the organic semiconductor material constituting the organic semiconductor layer is aligned anisotropically, in a specific direction, by contacting with the liquid crystal alignment layer.

5. The organic semiconductor structure according to claim 3, wherein the liquid crystal alignment layer comprises a curing resin having minute unevenness on the surface thereof, and the organic semiconductor material constituting the organic semiconductor layer is aligned anisotropically, in a specific direction, by contacting with the liquid crystal alignment layer.

6. The organic semiconductor structure according to claim 3, wherein the liquid crystal alignment layer comprises a base material and a curing resin having minute unevenness on the surface thereof, and the organic semiconductor material constituting the organic semiconductor layer is aligned anisotropically, in a specific direction, by contacting with the liquid crystal alignment layer.

7. The organic semiconductor structure according to claim 3, wherein the organic semiconductor material constituting the organic semiconductor layer is aligned anisotropically in a direction wherein the overlapping direction of electron orbitals of a skeletal structure comprising a π-electron ring agrees with a charge transport direction.

8. The organic semiconductor structure according to claim 2, wherein the organic semiconductor layer has an electron mobility of $10^{-5}$ cm$^2$/V·s or higher, or a hole transport mobility of $10^{-5}$ cm$^2$/V·s or higher.

9. An organic semiconductor device comprising at least a substrate, a gate electrode, a gate-insulating layer, an organic semiconductor layer, a drain electrode, and a source electrode, wherein the organic semiconductor layer is formed from the organic semiconductor material according to claim 1.

10. The organic semiconductor device according to claim 9, wherein the organic semiconductor layer has an electron mobility of $10^{-5}$ cm$^2$/V·s or higher, or a hole transport mobility of $10^{-5}$ cm$^2$/V·s or higher.

11. The organic semiconductor structure according to claim 2, wherein the semiconductor functions as a member of the group consisting of an organic transistor, an organic EL element, an organic electronic device and an organic solar battery.

* * * * *